United States Patent [19]

Lindberg

[11] Patent Number: 4,730,232

[45] Date of Patent: Mar. 8, 1988

[54] HIGH DENSITY MICROELECTRONIC PACKAGING MODULE FOR HIGH SPEED CHIPS

[75] Inventor: Frank A. Lindberg, Relay, Md.

[73] Assignee: Westinghouse Electric Corp., Pittsburgh, Pa.

[21] Appl. No.: 878,102

[22] Filed: Jun. 25, 1986

[51] Int. Cl.$^4$ .......................... H02B 1/00; H05K 7/20
[52] U.S. Cl. .................................... 361/381; 361/390; 361/392
[58] Field of Search ............... 361/381, 386, 389, 390, 361/392, 395, 391

[56] References Cited

U.S. PATENT DOCUMENTS 3,872,583  3/1975  Beall et al. .
4,399,487  8/1983  Neumann ........................... 361/391
4,509,096  4/1985  Baldwin et al. ..................... 361/386

*Primary Examiner*—Roy N. Envall, Jr.
*Attorney, Agent, or Firm*—W. G. Sutcliff

[57] ABSTRACT

A high density, multi-chip module applicable to VHSIC technology utilizing individually hermetically sealed microelectronic chip packages operable to be pretested, breadboarded and burned in prior to final module assembly. This microelectronic module comprises a multiplicity of interconnected chips in a high density fully heat sinked configuration, resulting in high clock speed and low power dissipation. This module further facilitates a short design cycle because no dedicated hard tooling is required. A packaging density is achieved which is about two and one-half times greater than the density achieved utilizing surface mounted leaded chip carriers with leads on 20 mil centers. This is because the packages are reduced in size after testing. This density increase results in a chip-to-chip line capacitance approximately half of conventional packaging due to the fact that the path lengths across the ceramic packages and across the P.C. board are reduced.

5 Claims, 8 Drawing Figures

HIGH DENSITY MICROELECTRONIC PACKAGING MODULE FOR HIGH SPEED CHIPS

BACKGROUND OF THE INVENTION

1. Field of the Invention

The present invention relates to a microelectronic packaging module utilizing single layer ceramic, individually hermetically sealed chip packages upon a pair of printed circuit boards mounted back to back. This multi-chip package approach facilitates high density packaging utilizing existing military standard formats via lightweight replaceable modules having low capacitance and low power dissipations. These modules are operable to function at high clock speeds, and are particularly suited in VHSIC (very high speed integrated circuit) opertions.

2. Description of the Prior Art

A multi-chip hybrid is usually considered a hermetically sealed enclosure having a multiplicity of bare active chips and other devices incorporated within. The problems associated with building hybrids are accepted in return for the advantage of the increased packaging density. This increase in packaging density, however, does not come about with all hybrids. Other assumptions with hybrid packaging are that:

(1) the hybrid will have a small number of input/output pins compared to the total number of bonding pads on the chips inside the hybrid, and (2) that the chips in a given circuit can be partitioned electrically and mechanically into hybrid packages such that most of the connections are made between the chips within a given hybrid and a smaller number of connections are made from one hybrid to another hybrid or from one hybrid to other single chip packages.

While these two assumptions may be true, in some cases they are not always true, especially in large circuits which require a significant number of high density, high speed gate arrays. If a large number of gate array chips is partitioned into a small number of hybrid packages, for example, 32 gate array chips partitioned into 4 hybrid packages, as many as 80 to 90% of the chips' input/output connections might have to come out of the hybrid packages.

Each chip could require connection to every other chip in the circuit as much or almost as much as it was connected to the other chips in the same hybrid package. These 8 chip hybrids would require in the neighborhood of 1,000 pins which would significantly detract from the hybrid's use and appeal. A similar situation would exist if a given module were to be divided in half and packaged in two modules. There would still be an excessively large number of connector pins required to connect the two modules together.

In addition to electrical partitioning problems, there are mechanical layout problems associated with hybrid packages in light of the small SEM (standard electronic module) size modules that are now required in military use. The largest of these standard sizes permits 5×5 inches of circuit board area upon which to place all of the utilizable components. A multi-chip hybrid would represent a significant fraction of that total amount of board area. In the layout of a relatively small board having large hybrids, there is a high probability of not being able to use all of the available board space unless a standard hybrid size were developed so that a predetermined number of hybrids would exactly cover all the available SEM board area.

For example, 4 hybrids each occupying $2\frac{1}{2} \times 2\frac{1}{2}$ inches would completely cover the area. With the SEM size established and the hybrid size established then the problem becomes one of partitioning the circuit in such a way that all of the space inside the hybrids would be used and that the pin-out requirements between the hybrids would be met. This is the same problem as fitting arbitrarily sized hybrids upon the SEM format. A risk exists inside the hybrid of not utilizing all of the hybrid area and of requiring too many input/output pins between the hybrids. An alternative method of utilizing a given amount of area is to fill it with a large number of small packages rather than a small number of large packages. One way to do this is to define the SEM module size as the hybrid size and build a large 5×5 inch hermetically sealed bare chip hybrid having a connector at one edge and calling this a standard electronic module (SEM).

The drawbacks to the large hybrid approach would be the risk associated with the hermetic sealing, unsealing and resealing of such large modules to make the inevitable bare chip replacements. It is not possible to thoroughly screen and burn-in bare chips. This module would, therefore, receive a large number of bare chip replacements.

In the prior art, packaging for a high speed chip having a plurality of contact pads and comprising a carrier and cover has been developed in utilizing multi-layer ceramic. This carrier would be formed of a base of insulating material having a generally planar area for receiving the chip. A cooling stud is mounted on the base and provided with one or more removable cooling fins. This stud, for example, would be mounted on the base under the area for receipt of the chip. Spaced leads would be carried by the base and have outer extremities which extended beyond the base in a direction away from the chip free from the carrier and having inner extremities which are in close proximity to the area for receiving the chip. A grounding bus would be carried by the carrier for the electrical checking of the package. This multi-layer ceramic co-fired structure resulting from the stack and firing at high temperatures of multiple layers of ceramic material was described in U.S. Pat. No. 3,872,583 dated Mar. 25, 1975. Inventors Robert J. Beall and John J. Zasio in their patent entitled "LSI Chip Package and Method" describe this multi-layer ceramic package.

The problem to be solved then is the design and fabrication of a high density microelectronic packaging module operable to provide high density packaging on a variety of module formats including the relatively small standard military formats. Further, this same module would require high clock speed and low power dissipation requires an interconnect structure having these conductors supported by a low dielectric constant material. This packaging module should allow pretest of the bread board and burn-in of the individual integrated circuit devices before commitment to the final assembly. This module would also have a short design cycle approach which inherently allows for timely insertion of high speed technology as it becomes available.

SUMMARY OF THE INVENTION

In accordance with the above-stated requirements, the present invention, a high density microelectronic packaging method suitable for use in various module sizes including standard military formats, utilizes high density packaging, whereby 2½ times greater packaging density is achieved compared to that of surface mounted leaded chip carriers.

The individual chip packages used for high density modules play a key role in the design fabrication and tests of this module. We utilize in this invention miniature chip packages on a ceramic carrier. These chip carriers have a conductive line fanout pattern which fans out first to a relatively close spacing such as a 10 mil center-to-center spacing, and then continues to fanout to a wider spacing such as a 20 mil center-to-center spacing. These packaged chips are individually tested and interconnected to one another by a large wire wrapped panel. This would enable the breadboard phase of the circuit to take place with the chips packaged in the same packages as the final configuration. The breadboard panel could be used to burn the circuit in. After tests and burn-in, the packages would be laser scribed from the back and snapped apart, removing the conductive lines that spread from the close spacing to the wider spacing. The resulting small package would have closely spaced bonding pads for wire bonding to the next level of interconnect which would be a multi-layer interconnect structure such as a printed circuit board.

These chip packages are operable to be mounted, replaced and rebonded to the printed circuit board several times due to the oblong bonding pads on the printed circuit board. And, the resulting module would have about half the chip-to-chip line capacitance as the same circuit would have if it were packaged with the 20 mil center leaded packages on a larger printed circuit board. Most of the power would be dissipated on in the chips output buffers and the overall heat dissipation of the circuit would therefore be cut in half.

The present invention meets SEM guidelines requiring that the module be made up of a board pair with a conduction cooling heat sink. Each printed circuit board is laminated to its own heat sink plane and populated with components as a single board. When the two printed circuit boards come together at final assembly, they are placed back-to-back or heat-sink-to-heat-sink and are held together by two covers. One cover has clearance holes for screws and the other cover has threaded holes in the same relative positions. Mounting screws would pass through one cover, through the two printed circuit boards, and screw into the second cover. This would facilitate repair if one of the printed boards becomes inoperable for some reason. One board could be removed from the module while the other side can be salvaged. This would not be possible if both boards were laminated permanently to the same heat sink. The two covers are rugged, lightweight and add considerable stiffness to the module assembly. The total populated weight of the module would be approximately 0.85 pounds (380 gms). The anticipated natural frequency of mechanical vibration is approximately 250 hertz with an amplification factor of about 20 to 1 at the center. This would mean that for a broad band random vibration input of 0.04 $G^2$/Hertz, the maximum response acceleration would be about 17.7 gms. Under these conditions, the maximum deflection at the center of the module would be about 2.8 mils and this amount of deflection and acceleration for wirebonds is minimal.

The proposed invention described is similar to conventional multi-chip hybrid design, except that each individual chip is hermetically sealed and burned in prior to final assembly. The large covers described above are not hermetically sealed and the interconnect board is an organic, low dielectric constant printed circuit board rather than a high dielectric constant ceramic multi-layer board. The chip packages are wire-bonded to the printed circuit board in much the same fashion that bare chips are wire bonded to a multi-layer ceramic hybrid substrate.

Chip packages are a single layer of ceramic having three layers screened and fired upon them. These chip packages can be made by moderate firing temperature technology (thick film) or by high temperature ceramic techniques. The first layer is a fine line fanout pattern which is made by screening or chemically etching a thick film gold layer or by laser etching a co-fired refractory metal layer on top of the ceramic. The patterns are etched in multiple patterns on a convenient size substrate. The next layer to be applied is a thick film glassy dielectric layer applied to the thick film version and fired at a moderate temperature (approximately 850° C.) or a low glass dielectric layer applied to the refractory metal version and fired at high temperature (about 1500° C.). These dielectric layers provide a foundation for the application of a metal seal ring upon which the cover can be soldered. This seal ring is applied as another thick film layer to the thick film version or as a refractory metal layer applied over the high temperature dielectric layer in the refractory metal package version. This refractory metal seal ring must connect to ground lines in the fanout pattern through holes provided in the dielectric layer so that it can be electroplated along with the rest of the exposed refractory metal.

The module covers can be made by press powder ceramic technology. Chip mounting and wire bonding are followed by cover attachment while the substrates are still in the multiple pattern form to facilitate handling many chips at one time.

After hermetic sealing each chip, these packages are separated by laser scribing into an intermediate size which is convenient for testing. For example, a convenient size of 0.95 in.$^2$ (2.4 cm$^2$). This is one of the JEDEC (joint electronic device engineering committee) standard sizes for leadless or leaded chip packages. This package size can have 64, 89 or 164 leads if the leads are on 0.050, 0.040 or 0.020 inch centers, respectively. Four-up packages having four fanout patterns are 0.95 in.$^2$ (2.4 cm$^2$) allowing four packages to fit into a 2 in.×2 in. (2.5 cm×2.5 cm.) substrate. The leads in each package fanout to a 0.020 inch (0.05 cm) center-to-center spacing at the perimeter such that the packages can be tested in fixtures made to the JEDEC standards. The conductor lines which fanout from the IC chip mounting pad to a 10 mil center-to-center spacing remain at the spacing for only a short distance. The lead lines continue to fanout to a 20 mil center-to-center spacing at the 0.95 in.$^2$ (2.4 cm$^2$) JEDEC size. While this package is in that size, it can be tested and burned in with fixtures conforming JEDEC sizes.

After each of the printed circuit boards is assembled and tested, two of these printed circuit boards will be placed back-to-back, (heat-sink-to-heat-sink) and held together by two covers, as described. Two alignment pins will pass through both covers and both board assemblies. These board pair modules will have screws passing through clearance holes in one cover and attaching to threaded holes or helical inserts in the other cover. When the covers are in place, the wirebonds inside are protected from the soldering operations which will be applied next.

As well known in the art, a connector can be held in place by two roll pins which pass through the connector and through the two central heat sinks. The roll pins will fit tight in the heat sinks and loosely in the connector allowing it to float freely. The contact pins in the connector are connected to the portion of the boards which protrude through the two metal covers by a small section of flex cable which comes with the connector. After the connector is attached to the module by the two pins, the flex cable is soldered to the exposed conductor stripes on the printed circuit boards. In the examples described, there will be 125 edge stripes on a 40 mil center-to-center spacing.

On the edge of the module that's opposite the connector, the printed circuit boards protrude under the covers in a similar fashion. There is room for 110 connections on 40 mil centers or 220 connections on 20 mil centers. These edge stripes offer connection from side-to-side over the top edge of the module by a soldered section of flex cable. There is a protective cover for this flex cable which is held in place by two roll pins through which the heat sinks pass.

The completed module therefore can be thought of as a large printed-circuit-board-size plug-in hybrid. The main differences between this and the more conventional hybrids are that the interconnect board is organic rather than ceramic, that each chip is sealed individually and burned-in prior to final assembly, and the overall module is not hermetically sealed.

The module configuration as made and addressed in this invention, resolves the problem of placing a large number of high lead count, high speed or VHSIC chips on a small format. This module wil interconnect computer circuits containing high speed chips wherein all chips are packaged in the miniature wirebond packages.

BRIEF DESCRIPTION OF THE DRAWINGS

For a better understanding of the invention, reference may be had to the preferred embodiment exemplary of the invention shown in the accompanying drawings in which.

DESCRIPTION OF THE PREFERRED EMBODIMENTS

Figure 1:
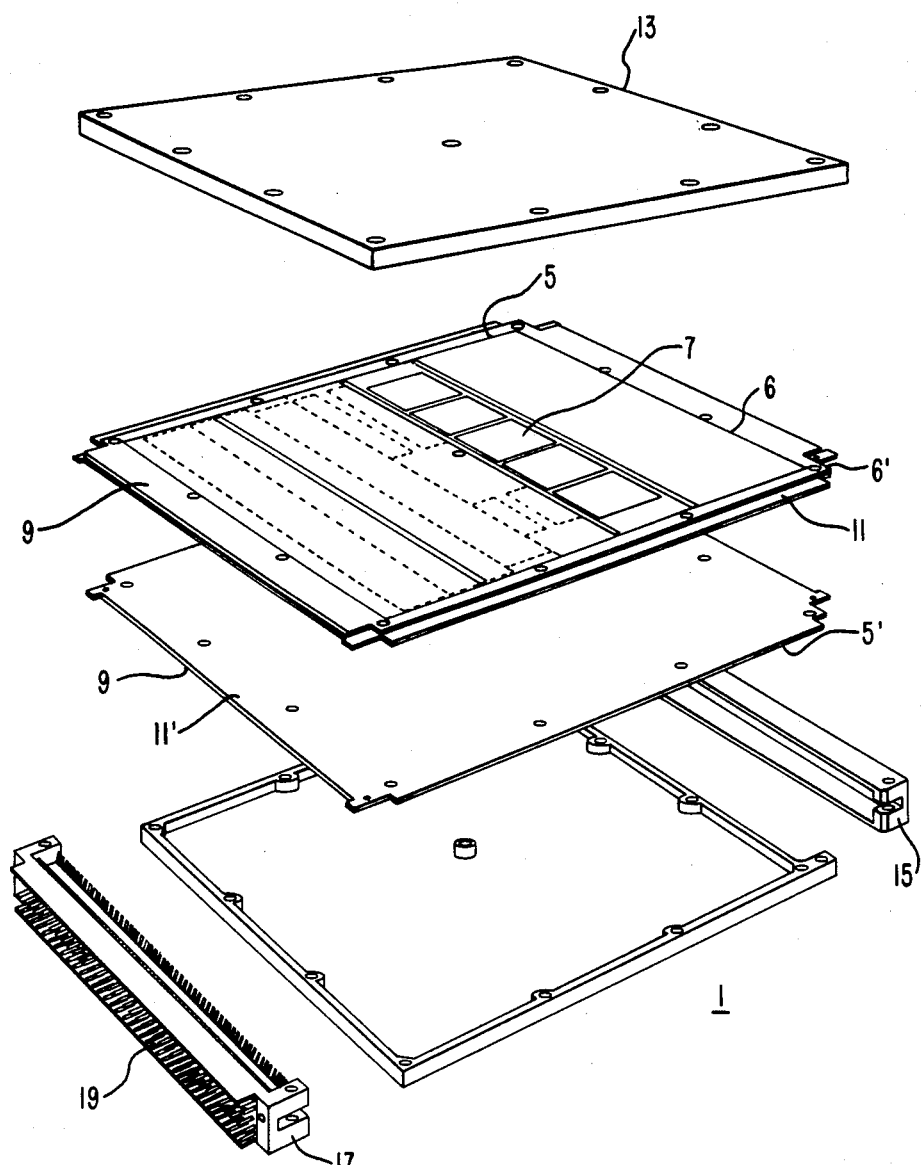
FIG. 1 is an orthogonal exploded view of the high density microelectronic module.
Figure 3:
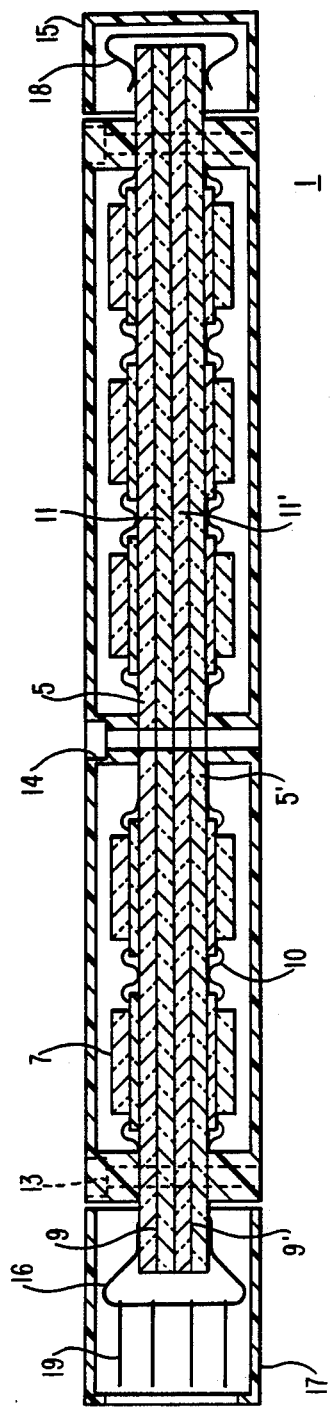
FIG. 3 is a cross-section of the high density microelectronic module.

FIG. 1 is an orthogonal exploded view of the high density microelectronic module 1. This module 1 comprises two printed circuit boards 5 and 5'. The first printed circuit board 5 is shown having a planar lateral surface 6. Upon this planar lateral surface 6, are a multiplicity of microelectronic chip packages 7. These microelectronic chip packages 7 are arranged in a linear fashion upon the lateral surface 6 of the first printed circuit board 5. At one end of the printed circuit board 5 is an input/output strip 9. This input/output strip 9 is operable to facilitate the input and output of power supply voltages and signals during module 1 operation. The printed circuit board 5 further comprises a heat sink 11. This heat sink 11 is layered upon the opposing lateral surface 6' of the printed circuit board 5. A second printed circuit board 5' is also shown. This second printed circuit board 5' and its heat sink during module assembly will be placed back-to-back (heat sink to heat sink) with printed circuit board 5. This second printed circuit board 5' having a second heat sink 11' will be interconnected further after the two demountable covers 13 are placed upon printed circuit board 5 and printed circuit board 5' as shown in FIG. 3. These demountable covers 13 are not hermetically sealed since each individual chip package 7 in and of itself will be individually hermetically sealed. Further, these two covers 13 may be removed for maintenance purposes and to facilitate the prompt change of microelectronic chip packages 7 during the working life of the module 1. The demountable covers 13 are held in place by screws which pass through the top cover 13 and screw into the lower cover. A back plate end cap 15 adn a front end connector 17, which have a multiplicity of pin connects 19, are held in place with pins which pass through the heat sinks 11 and 11'. This front end connector 17 will be in direct electrical contact with the edge contacts 9 of the first circuit board 5 and the edge contacts 9' of the second printed circuit board 5'.

Figure 2:
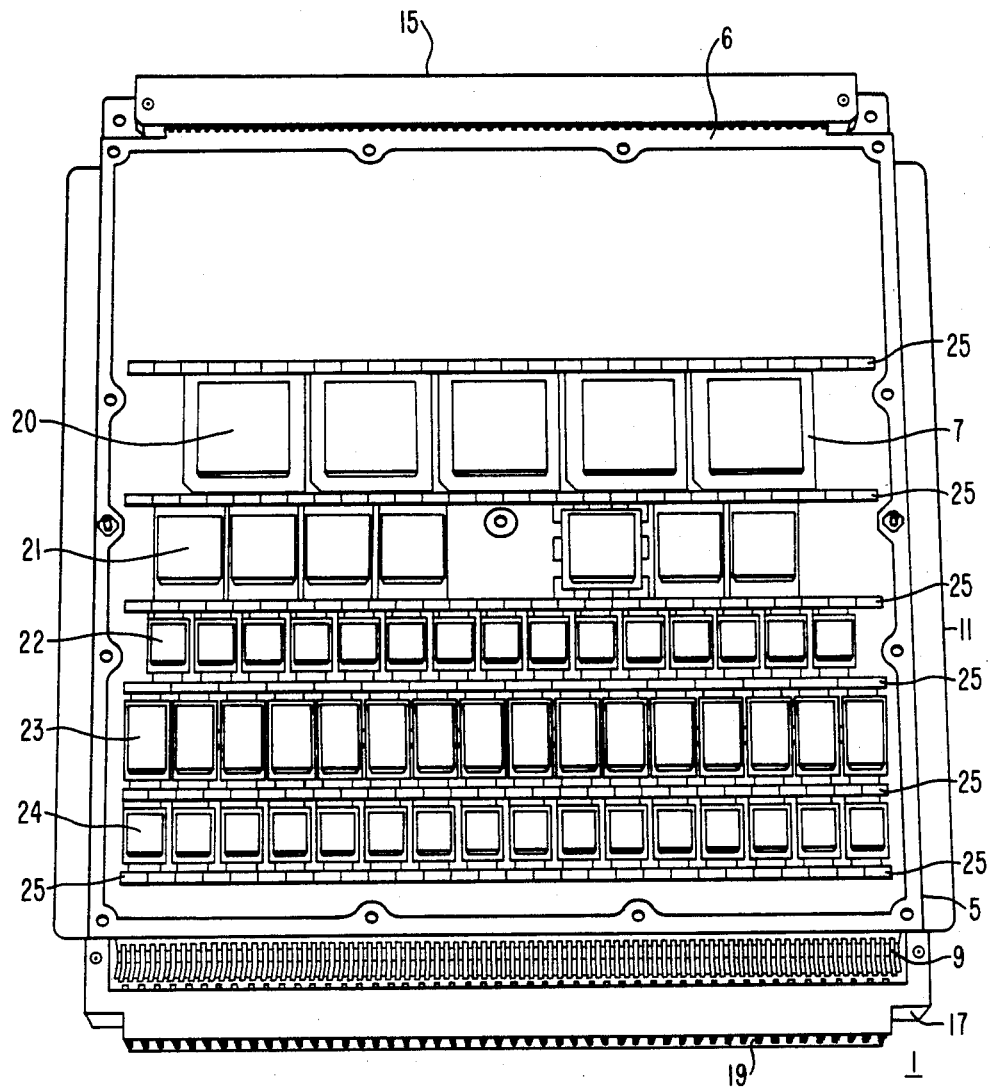
FIG. 2 is a plan view of the high density microelectronic module in full assembly.

FIG. 2 is a plan view of the printed circuit board 5, with the demountable cover 13 removed. Specifically, the printed circuit board 5 is shown with its first surface 6 and heat sink 11 having a multiplicity of individually hermetically sealed microelectronic chip packages 7 mounted upon it. In this specific embodiment, we see the printed circuit board 5 in its configuration as a computer. Row 1, is a linear assembly of gate array chips 20. Row 2, is a linear array of PROMS 21 (programmable read only memory) and a multiplier. Row 3, is an array of buffers and drivers 22. Row 4 is a linear configuration of random access memories or RAMS 23. And finally Row 5 is a linear array of buffers, drivers and input/output chips 24. Several linear rows of decoupling capacitors 25 are also shown. All of these chips are interconnected to each other via the underlying substrate of connecting circuitry within the multi-layer printed circuit board 5. Input/output leads 9 interconnect with the multiplicity of pins 19 contained in the front end connector 17. Utilizing pretested, burned-in packaged chips 7, this computer would be mountable back-to-back with the second printed circuit board 5' permitting the incorporation of more memory (RAM) and could be utilized in military standard applications.

FIG. 3 is a cross-section of the module 1 showing a two-printed-circuit-board 5 and 5' configuration. In this configuration, the first printed circuit board 5 has upon on it a multiplicity of individually hermetically sealed chip packages 7. These chip packages are interconnected by wirebonds 10 to the printed circuit board 5 and 5'. A heat sink 11 is laminated to the undersurface of the printed circuit board 5. The second printed circuit board 5' also has a heat sink 11' and the two boards are connected together via a series of connecting screws or mounting screws 14. The end cap 15 provides mechanical protection for a crossover connection 18 which provides electrical contact between the two printed circuit boards 5 and 5'. A front end connector 17 having a multiplicity of input/output pins 19 connects to both printed circuit boards 5 and 5'. A plurality of flexible connector ribbons, 16, make the connection between the edge connections 9 and 9' on the boards 5 and 5' to the pins 19 of the connector 17. The demountable covers are held in place by the mounting screws 14 which pass through the printed circuit boards and their respective heat sinks. If it were necessary to replace an individual chip package 7 as shown on the FIG. 3, the mounting screws 14 would be removed, one of the demountable covers 13 would then be removed exposing one printed circuit board 5 or 5'. The chip package in question if found to be defective could then be effectively removed and the module 1 could be reassembled via the replacement of the demountable cover 13 and the remounting of the mounting screws 14.

Figure 4:
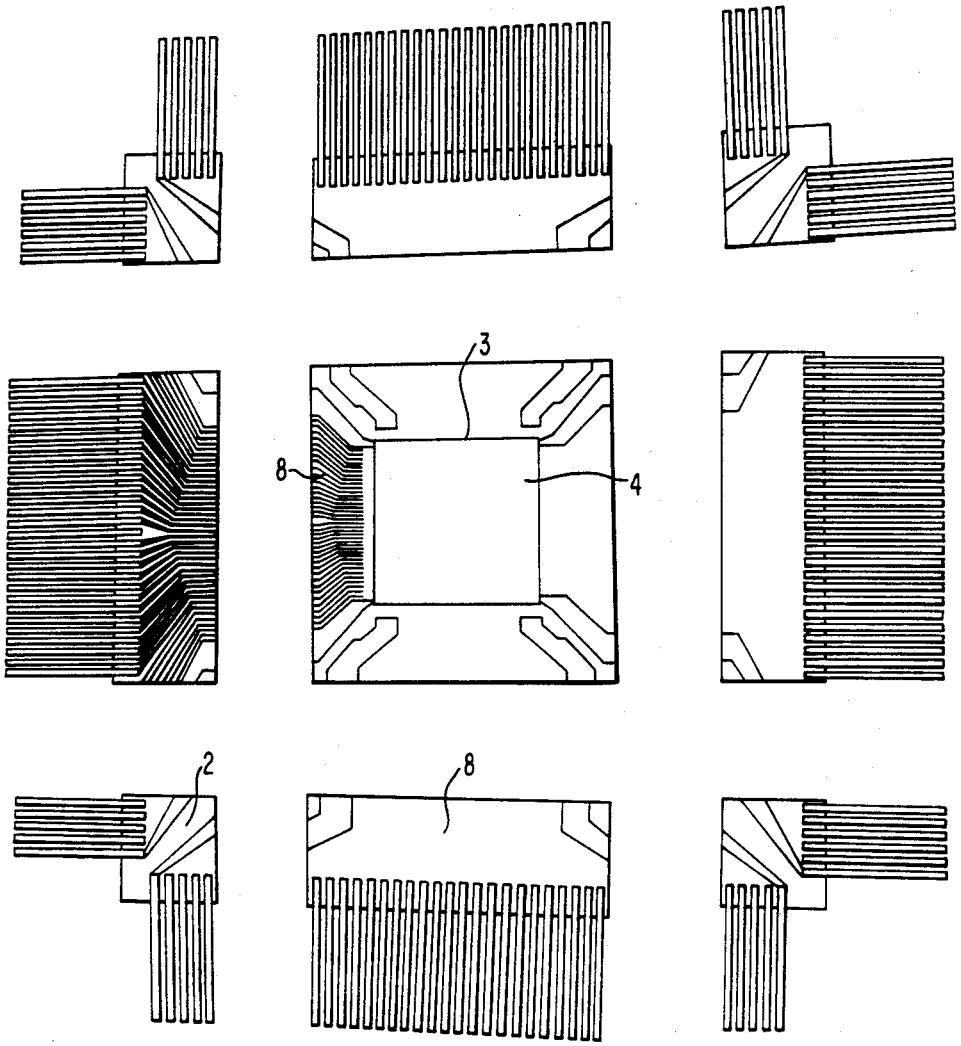
FIG. 4 is a plan view of a plurality of conductor fanout patterns which are representative of the first layer of conductor lines contained in the chip packages.

FIG. 4 is a plan view of the single ceramic layer chip package shown with the chip in proper position but with no cover. The conductor fanout pattern 8 is shown but the additional layers of metal and dielectric material which are applied on top of the fanout pattern are also not shown. The fanout conductor pattern 8 starts at the edge of the chip 4 with a close spacing typically 6 mils center to center. It fans out to a wider spacing typically 10 mils center to center and maintains this spacing for a short distance. It continues to fan out to a wider yet spacing which is convenient for electrical test, typically 20 mils center to center. At this wide spacing, the package can be tested easily in a test fixture and then burned in. FIG. 4 also shows that after test and burn-in, the back of the ceramic 2 can be scribed with a laser and the portion of the fanout pattern which goes from 10 mils to 20 mils can be snapped off and discarded, resulting in the individual chip package 5 with external lead lines on a 10 mil pitch 8.

Figure 5:
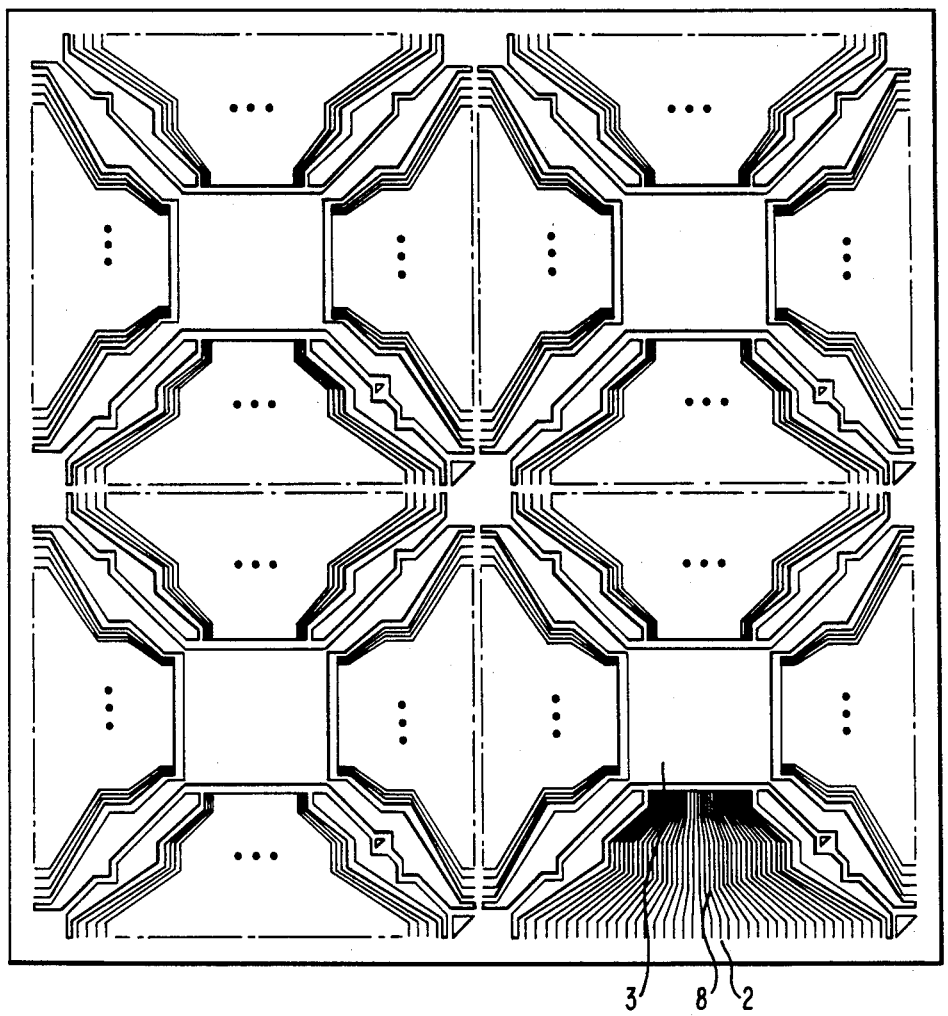
FIG. 5 is a plan view of the chip package with disassociated fanout lines at various pitch.

FIG. 5 is a plan view of four, such fanout configurations. In this manner, four individual packages may be fabricated simultaneously.

Figure 6:
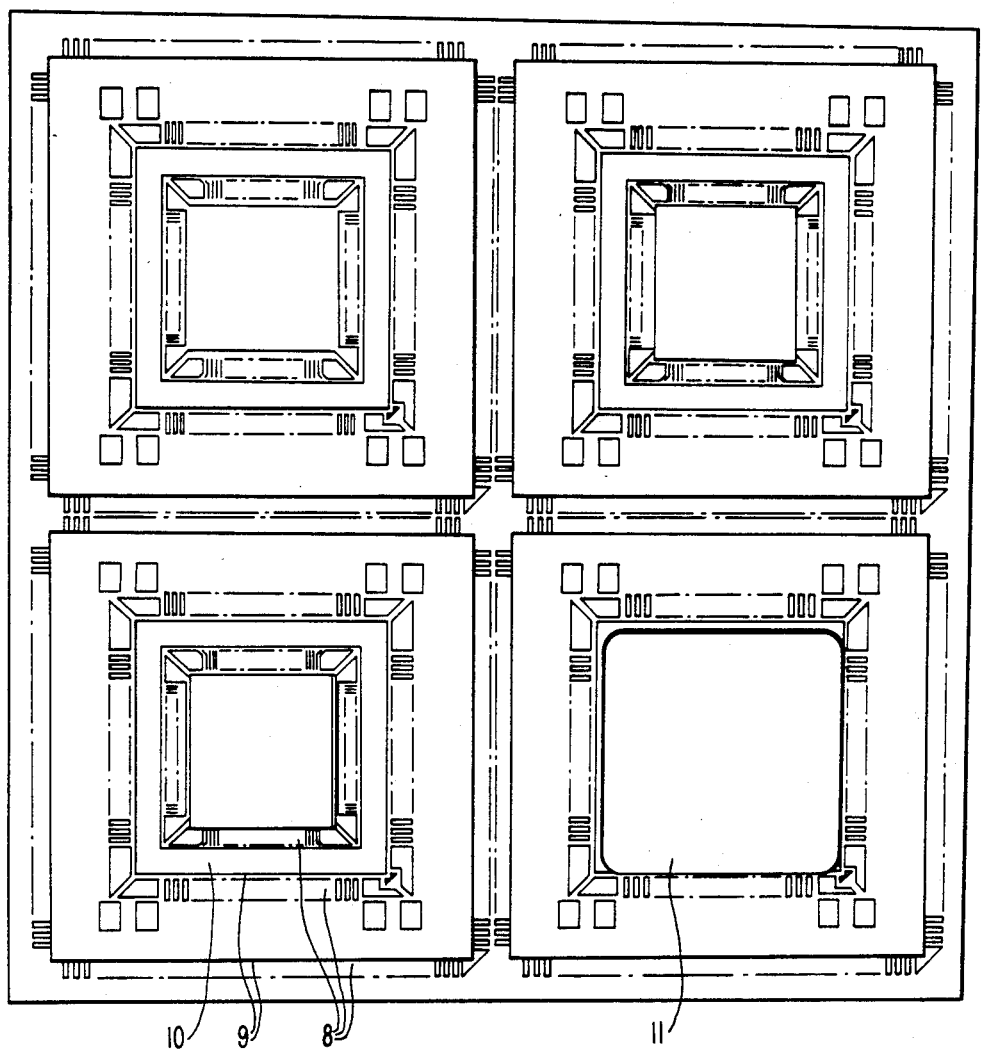
FIG. 6 is a plan view of a plurality of chip packages showing various stages of completion including chip mounting and cover attachment (hermetic sealing)

FIG. 6 is a plan view of a plurality of chip packages formed on the same ceramic substrate. The fanout pattern 8 and the subsequent dielectric layer 9 and seal ring 10 are shown. Two of the patterns have chips mounted and one pattern had a hollow ceramic cover 11 soldered to the seal ring 10 over the chip. This method of batch fabrication allows for low cost assembly. After all covers are attached, the packages will be separated for test and then cut down to their final small size.

Figure 7:
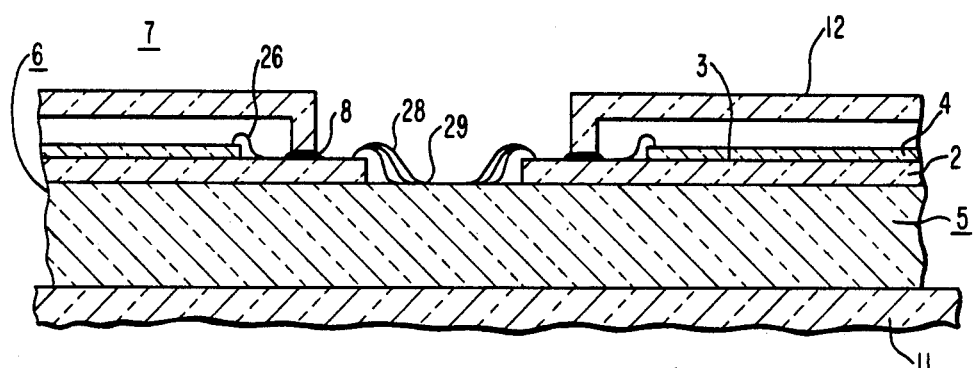
FIG. 7 is a cross-section of the multi-layer printed circuit board showing the connection of the ceramic chip packages to the wirebond pads.

As shown in FIG. 7, we have a cross-section of the multi-layer printed circuit board 5 with its intended heat sink 11 and a cross section of two chip packages 7 having now the full interconnection between the chips 4 and external circuitry via wire bonds 26 and 28. Mounted upon the printed circuit board 5 are the individual chip packages 7. The base of each chip package 7 is made of a single layer of ceramic 2 having upon it a mounting pad 3 to mount a chip 4 of semiconductor material. After hermetic sealing test and burn-in, this package 7 is mounted upon the printed circuit board 5. These fanout lead lines which are layered upon the ceramic substrate 2 connect to the chip 4 with wire bonds 26 and are further connected to the external circuitry via wirebonds 28 to bonding pads 29.

Figure 8:
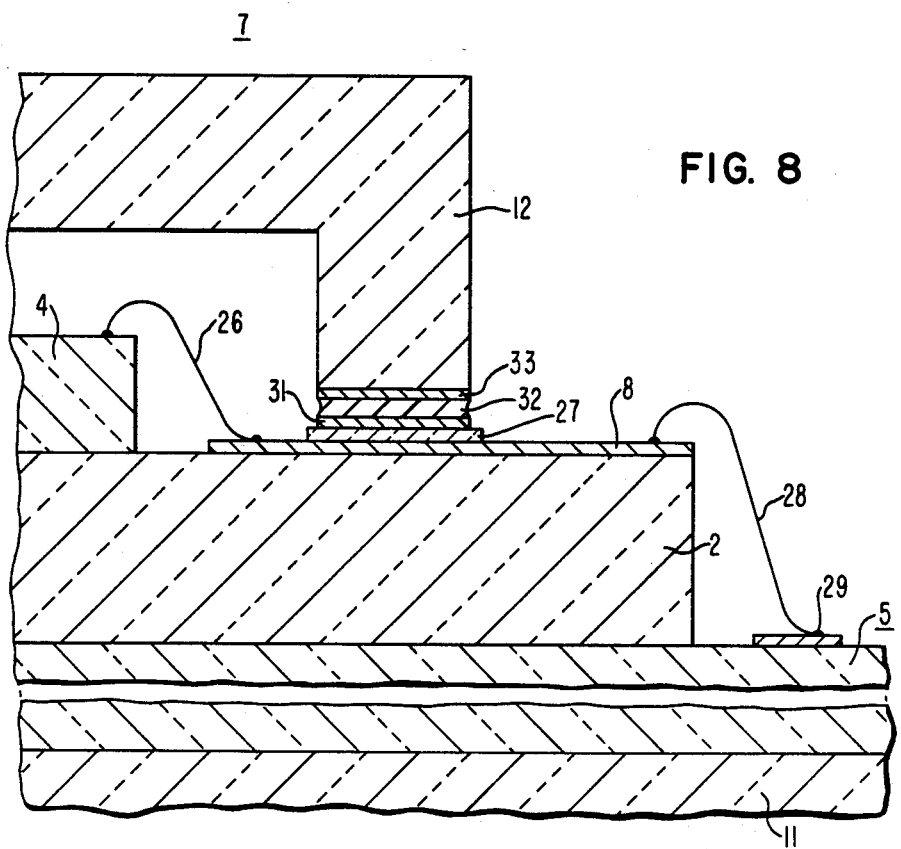
FIG. 8 is a cross-section of the hermetic joint between the cover and the ceramic substrate portion of the individual chip package.

FIG. 8 is a cross section in depth of the printed circuit board 5 with intended heat sink 11 and ceramic layer 2 with chip 4 interconnected via wirebond 26 to the metal circuitry fanout 8. The metal circuitry 8 is connected to the bonding pad 29 via external wirebond 28 which can be moved into a variety of positions upon the multi-layer board 5. The cross section of FIG. 8 shows the interconnection of the ceramic cover 12 for the individual hermetically sealed chip packages 7 as being placed upon the ceramic 2 utilizing a series of layered metals dielectrics and solder. The single layer ceramic 2 is first layered with its metal fanout lines 8 and is then layered with dielectric material 27. Upon this dielectric material 27, is a metallic layer 31. This metallic layer 31 provides a metal surface upon which to solder a hollow ceramic cover 12 which is made with its own metal layer 33 attached to the rim of the open end of the cover which is soldered to metal layer 31 by solder 32 during reflow. The solder attachment process of the cover is well-known art and is done at reflow temperatures which are low enough so as not to damage the chip 4. The structure as shown in FIG. 8 is unique over the prior art in that it uses single layer ceramic and interconnected metallic and dielectric layers to provide an individually hermetically sealed structure for each individual chip 4. Testing is done at an enlarged package size and final assembly is done with the packages reduced to smaller sizes. The prior art utilizing a multi-layer ceramic configuration would not easily facilitate design changes due to the requirement for hard tooling. Consequently, the module 1 with its individually hermetically sealed chip packages 7 provides the opportunity for repair and maintenance without breaking hermetic seals.

Numerous variations may be made in the above-described combination and different embodiments of this invention may be made without departing from the spirit thereof. Therefore, it is intended that all matter contained in the foregoing description and the accompanying drawings shall be interpreted as illustrative and not in a limiting sense.

We claim:

1. A multi-chip, high density, lightweight module having fully demountable covers, producing low capacitance and low power dissipation, said module operable to function at high clock speeds, comprising:
 at least one multi-layer printed circuit board, said multi-layer circuit board having a first and a second planar lateral surface, and a first and second end, said printed circuit board further comprising;
 a multiplicity of fully enclosed individually hermetically sealed, microelectronic chip packages mounted upon said first lateral surface of said printed circuit board, said microelectronic chip packages further comprising, a single layer of insulating material having a region sufficient to receive and retain a microelectronic chip, a multiplicity of electrically conductive chip lead lines in fanout configuration, said electrically conductive chip lead lines configured with a predetermined spacing, further said electrically conductive chip lead lines wirebonded to circuit board bonding pads upon said printed circuit board by individual wirebonds,
 a multiplicity of electrically conductive connecting means layered within and upon said multi-layer printed circuit board, said electrically conductive connecting means operable to interconnect via said circuit board bonding pads and said wire bonds, said individual microelectronic chip packages thereby forming electrical circuits upon said first lateral face of said printed circuit board, a multiplicity of input and output electrically conductive circuit board lead lines positioned at said first end of said printed circuit board, said circuit board lead lines operable to input electrical signals into said electrical circuits layered within and upon said first lateral surface of said printed circuit board and said circuit board lead lines further operable to output electrical signals from said electrical circuits within and upon said first lateral surface of said printed circuit board, a heat sink means layered upon said second lateral surface of said printed circuit board, said heat sink means comprising a heat conducting material operable to transfer heat generated by said microelectronic chip packages during said module operation, said heat sink means extending the full surface area of said printed circuit board, and said heat sink means extending beyond the two surfaces of said printed circuit board, connectable to said heat sink means;

a first and a second demountable cover means of a lightweight material operable to be interconnected via a plurality of threaded means, said first cover means operable to be placed upon said first planar lateral surface of said printed circuit board, and said second cover means operable to be placed upon said heat sink means upon said second planar lateral surface of said printed circuit board, said first and said second demountable cover means operable to be fully removed to facilitate said module repair, a first end connector means comprising a protective end cap means, said protective end cap means operable to interconnect said first and said second demountable cover means encovering said printed circuit board, and a second end connector means comprising a protective end cap means having integral electrical interconnections within said second end connector means said second end connector means further comprising a multiplicity of input/output pins external to said protective end cap means, said second end connector operable to be positioned and interconnected with said lead lines of said printed circuit board, said second end connector means further operable to input and output power supply voltages and electrical signals to said electrical circuits within and upon said printed circuit board during said module function.

2. A multi-chip, high density, lightweight module as set forth in claim 1, wherein said microelectronic chip packages further comprise a single layer of insulating material having a square configuration, said insulating layer having in the midst thereof a mounting region operable to receive and retain a microelectronic chip, upon said layer a multiplicity of electrically conductive microelectronic chip lead lines positioned about said mounting region in the midst of said insulating layer and extending to the edges of said insulating layer.

3. A multi-chip, high density, lightweight module having fully demountable convers, producing low capacitance and low power dissipation, said module operable to function at high clock speeds, said module further comprising a printed circuit board as described in claim 1, wherein said multiplicity of fully enclosed individually sealed microelectronic chip packages are arranged upon said printed circuit board in a series of five rows (a first, a second, a third, a fourth and a fifth), said rows comprising said ceramic chip packages of like nature and configuration.

4. A multi-chip, high density, lightweight module having fully demountable covers, producing low capacitance and low power dissipation, said module operable to function at high clock speeds, whereby said five rows of said microelectronic chip packages as in claim 3, further comprises; said first row, a linear configuration of a plurality of gate array microelectronic chip packages, said second row a linear configuration of a plurality of programmable read only memory microelectronic chips, said third row, a linear configuration of a plurality of buffers microelectronic chip packages, said fourth row, a linear configuration of a plurality of read only memory microelectronic chips, and said fifth row, a linear configuration of a plurality of input output microelectronic chip packages, said first and second, said third, said fourth, and said fifth rows all so interconnected as to be operable to produce a computer.

5. A multi-chip, high density, light-weight module having fully demountable covers, producing low capacitance and low power dissipation, said module operable to function at high clock speeds, comprising:

a first and a second multi-layer circuit board, both of said boards having a first and a second planar lateral surface, and a first and second end, said first and said second printed circuit boards both, further comprising;

a multiplicity of fully enclosed individually hermetically sealed, microelectronic chip packages mounted upon said first lateral surfaces of said first and said second multi-layer circuit boards, said microelectronic chip packages further comprising, a single layer of insulating material having a region sufficient to receive and retain a microelectronic chip, a multiplicity of electrically conductive chip lead lines in a fanout configuration, said chip lead lines configured with a predetermined spacing, further said chip lead lines wirebonded to circuit board bonding pads upon said first and said second multi-layer circuit boards, by wirebonds, a multiplicity of electrically conductive connecting means layered within and upon said first and said second multi-layer printed circuit boards, said electrically conductive connecting means operable to interconnect via said first and said second multi-layer circuit board bonding pads and said wirebonds, said individual microelectronic chip packages thereby forming electrical circuits upon said first lateral surfaces of said first and said second multi-layer printed circuit boards, a multiplicity of input and output electrically conductive circuit board lead lines positioned at said first ends of said first and said second multi-layer printed circuit boards, said circuit board lead lines operable to input electrical signals into said circuits layered within and upon said first lateral surfaces of said first and said second multi-layer printed circuit boards, and said circuit board lead lines further operable to output electrical signals from said circuits within and upon said first lateral surfaces of said first and said second multi-layer printed circuit boards, a heat sink means layered upon said second lateral surfaces of said first and said second multi-layer printed circuit boards, said heat sink means comprising a heat conducting material operable to transfer heat generated by said microelectronic chips during said module operation, said heat sink means further physically extending beyond the full surface area of said first and said second multi-layer printed circuit boards, and said heat sink means extending beyond two opposite sides of said first and said second multi-layer circuit boards connectable to said heat sink means, a first and a second demountable cover means of a light-weight material, said first and said second demountable cover means operable to be placed over said first lateral surfaces of said first and said second multi-layer printed circuit boards while said first and said second multi-layer printed circuit boards are mounted against each other, the heat sink means of said first multi-layer printed circuit board contacting the heat sink means of said second multi-layer printed circuit board means, said first and said second demountable cover means operable to be fully removed to facilitate said module repair.

a first end connector means comprising a protective end cap lined with an electrically conductive material, said first end connector means operable to interconnect said first and said second demountable cover means encovering said first and said second printed circuit boards, said first end connector means further operable to electrically interconnect said second ends of said first and said second multi-layer printed circuit boards said multiplicity of electrically conductive chip lead lines upon said first lateral surfaces of said first and said second multi-layer printed circuit boards, and a second end connector means said second end connector means comprising a protective end cap lined with an electrically conductive material and further comprising a multiplicity of input/output pins, said second end connector means operable to be so positioned upon the contacting ends of said first ends of said first and said second multi-layer printed circuit boards to be operable to electrically interconnect both said first and said second multi-layer printed circuit boards by said first ends by said multiplicity of input/output pins of said second end connector means operable to input and output power supply power and electrical signals to said first and said second multi-layer printed circuit boards during said module operation.

* * * * *